US008872200B2

(12) United States Patent
Mori

(10) Patent No.: US 8,872,200 B2
(45) Date of Patent: Oct. 28, 2014

(54) DISPLAY DEVICE AND ELECTRONIC APPARATUS

(75) Inventor: Tsutomu Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/415,006

(22) Filed: Mar. 8, 2012

(65) Prior Publication Data

US 2012/0235178 A1 Sep. 20, 2012

(30) Foreign Application Priority Data

Mar. 16, 2011 (JP) ................... 2011-057573

(51) Int. Cl.
*H01L 51/52* (2006.01)
*H01L 27/32* (2006.01)
*H01L 51/00* (2006.01)

(52) U.S. Cl.
CPC ........ *H01L 27/3216* (2013.01); *H01L 51/5206* (2013.01); *H01L 2251/558* (2013.01); *H01L 27/3211* (2013.01); *H01L 51/0004* (2013.01)
USPC .................. 257/89; 257/88; 257/91; 438/35; 345/698

(58) Field of Classification Search
CPC .................................. H01L 27/3211–27/3223
USPC ................. 257/88–93; 438/35; 313/504–506; 345/205, 206, 698
See application file for complete search history.

(56) References Cited

U.S. PATENT DOCUMENTS

| 7,259,514 B2* | 8/2007 | Murayama et al. | 313/506 |
| 2007/0106443 A1* | 5/2007 | Lu | 701/70 |
| 2007/0108443 A1* | 5/2007 | Kim | 257/40 |
| 2007/0145350 A1* | 6/2007 | Kobori | 257/13 |
| 2009/0215354 A1* | 8/2009 | Maeda et al. | 445/58 |
| 2010/0120185 A1* | 5/2010 | Miyashita et al. | 438/29 |
| 2010/0259165 A1* | 10/2010 | Miura | 313/505 |

FOREIGN PATENT DOCUMENTS

| JP | 2004-327067 A | 11/2004 |
| JP | 2007-073532 A | 3/2007 |
| JP | 2010-158799 A | 7/2010 |

* cited by examiner

*Primary Examiner* — Cheung Lee
*Assistant Examiner* — Stephen Bradley
(74) *Attorney, Agent, or Firm* — Wolf, Greenfield & Sacks, P.C.

(57) ABSTRACT

Disclosed herein is a display device including a plurality of pixels configured to have a first electrode, a light emitting layer, and a second electrode in that order over a substrate, wherein: the plurality of pixels include a first pixel having a first light emitting layer common to the pixels and a second pixel having the first light emitting layer and a second light emitting layer provided on each second pixel basis; and a surface of the first electrode in the first pixel is closer to the substrate than a surface of the first electrode in the second pixel.

16 Claims, 15 Drawing Sheets

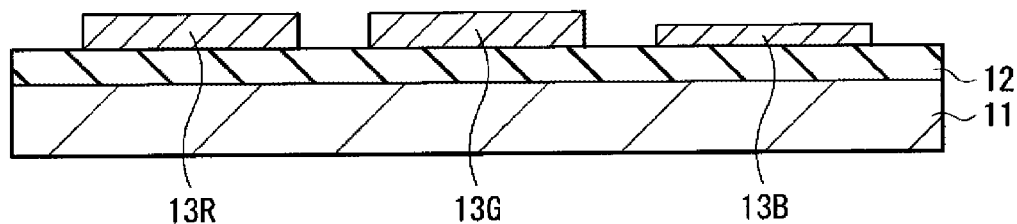
FIG.6A
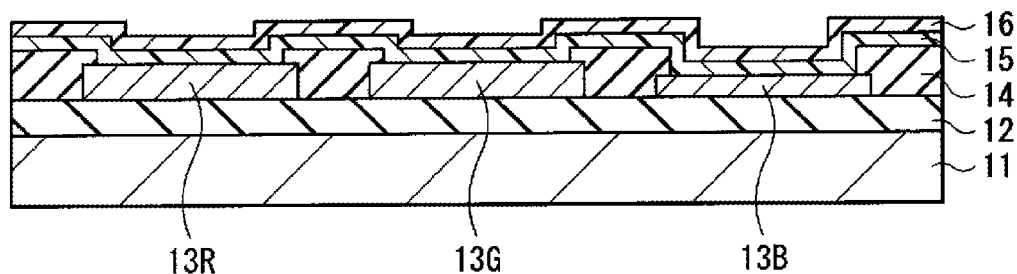
FIG.6B
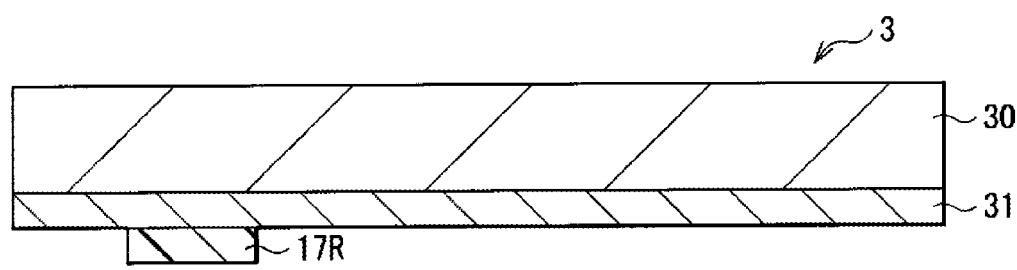
FIG.6C
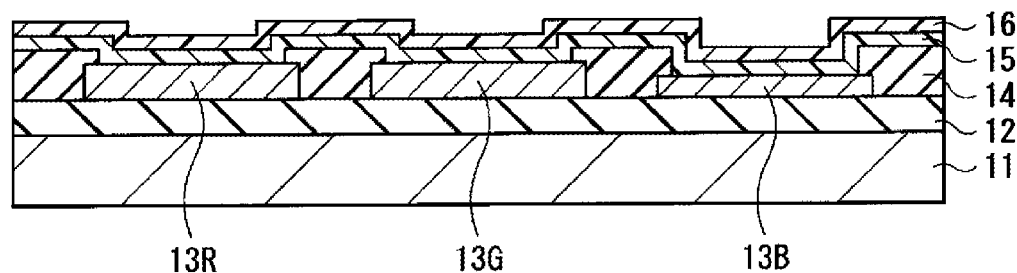

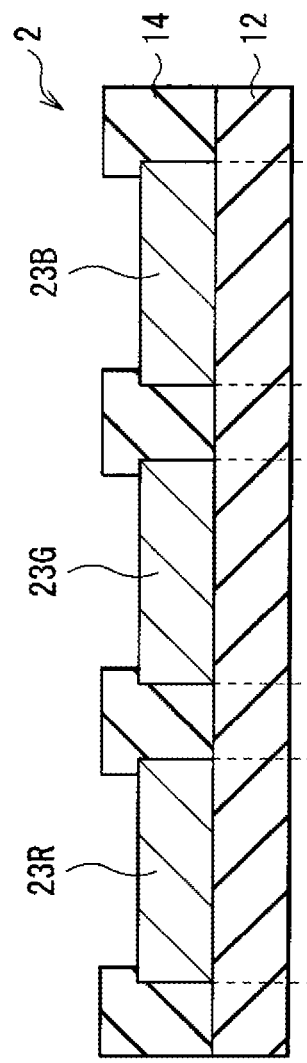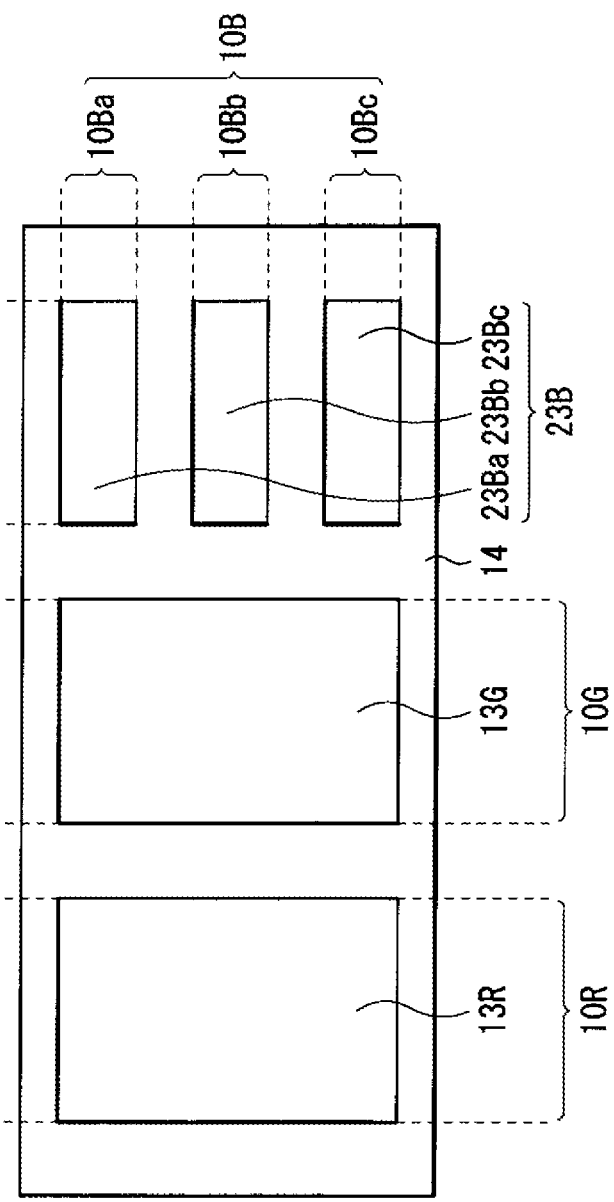

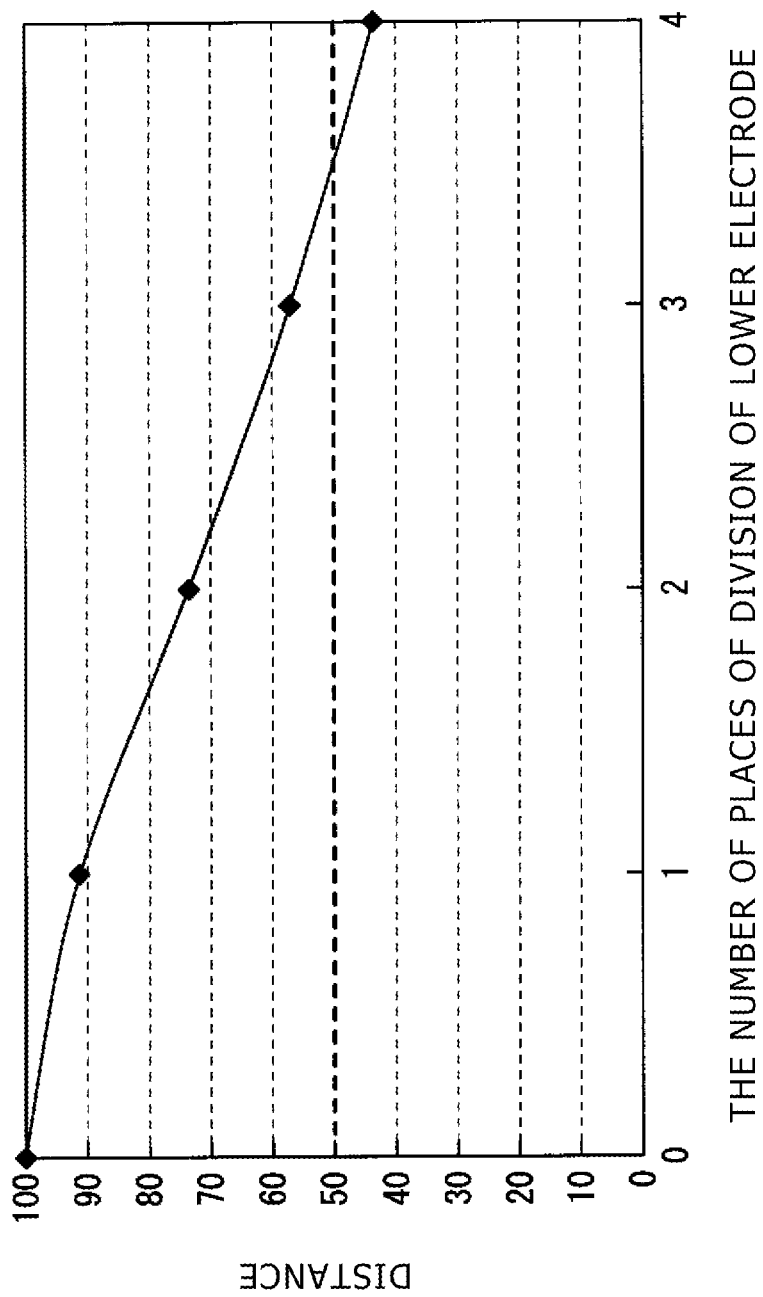

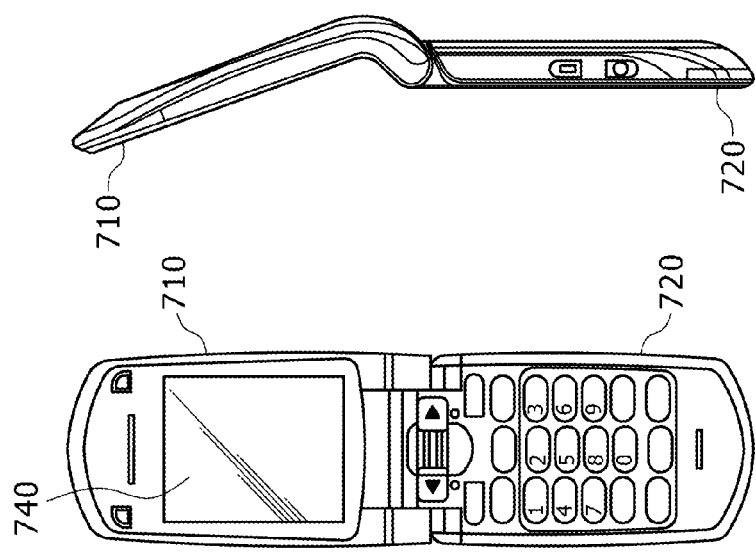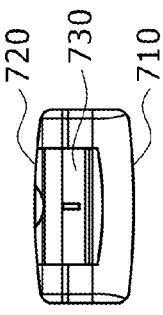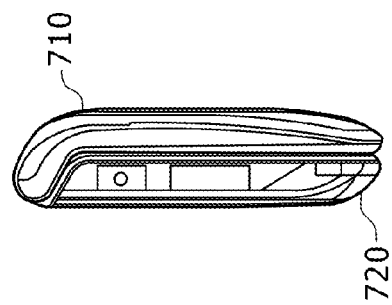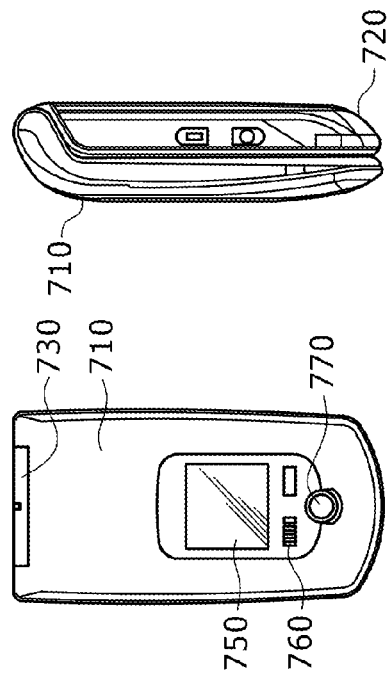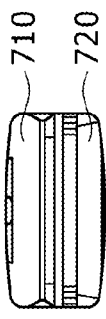

DISPLAY DEVICE AND ELECTRONIC APPARATUS

BACKGROUND

The present disclosure relates to a display device such as an organic EL (electroluminescence) display device and electronic apparatus.

Along with acceleration of development of the information communication industry, high-performance display elements are required. For example, the organic electroluminescence (EL) display element is a self-luminous display element and is attracting attention as a next-generation display element in terms of wide viewing angle, contrast, and response speed.

For the organic EL display element, mainly a dry method (evaporation method) such as a vacuum evaporation method and a wet method such as a coating method or a printing method are used as the film deposition method for an organic layer including the light emitting layer. In view of the relationship between the film deposition method and the material of the light emitting layer suitable for it, a method in which red and green light emitting layers are patterned on a pixel-by-pixel basis by a wet method and a blue light emitting layer is formed thereon by a vacuum evaporation method has been proposed (refer to e.g. Japanese Patent Laid-open No. 2007-73532).

Furthermore, in recent years, a reverse offset printing method is attracting attention as the wet method for patterning the red and green light emitting layers because it allows favorable film thickness accuracy and highly-accurate printing (refer to e.g. Japanese Patent Laid-open No. 2004-327067 and Japanese Patent Laid-open No. 2010-158799).

In the reverse offset printing, first a blanket on which an ink (material of light emitting layer) is applied is brought into contact with a plate in which a concave part having a predetermined pattern is formed, to form a transfer layer on the blanket side. This transfer layer is obtained as an object patterned corresponding to the concave part of the plate. The blanket on which this transfer layer is formed is brought into contact with a transfer-target substrate and thereby printing onto the transfer-target substrate is performed.

SUMMARY

However, the film deposition of the red and green light emitting layers by the reverse offset printing method has a problem that the blue pixel is affected in the printing step and the reliability of the display device is lowered.

There is a need for a technique to provide a display device and electronic apparatus that allow suppression of the reliability lowering in the film deposition step of the light emitting layer.

According to an embodiment of the present disclosure, there is provided a first display device including a plurality of pixels configured to have a first electrode, a light emitting layer, and a second electrode in that order over a substrate. The plurality of pixels include a first pixel having a first light emitting layer common to the pixels and a second pixel having the first light emitting layer and a second light emitting layer provided on each second pixel basis. The surface of the first electrode in the first pixel is closer to the substrate than the surface of the first electrode in the second pixel.

According to another embodiment of the present disclosure, there is provided a second display device including a plurality of pixels configured to have a first electrode, a light emitting layer, and a second electrode in that order over a substrate. The plurality of pixels include a first pixel having a first light emitting layer common to the pixels and a second pixel having the first light emitting layer and a second light emitting layer provided on each second pixel basis. The surface of the first electrode in the first pixel is divided into at least two regions by an insulator.

In the first and second display devices of the embodiments of the present disclosure, the surface of the first electrode in the first pixel is closer to the substrate than the surface of the first electrode in the second pixel or the surface of the first electrode in the first pixel is divided into at least two regions by an insulator. Therefore, for example in film deposition of the second light emitting layer with use of a blanket, strong contact of the blanket with the first pixel area is avoided.

According to other embodiments of the present disclosure, there are provided first electronic apparatus and second electronic apparatus including the first and second display devices of the above-described embodiments of the present disclosure.

In the first display device and the first electronic apparatus of the embodiments of the present disclosure, the surface of the first electrode in the first pixel is set closer to the substrate than the surface of the first electrode in the second pixel. In the second display device and the second electronic apparatus of the embodiments of the present disclosure, the surface of the first electrode in the first pixel is divided into at least two regions by an insulator. Thus, strong contact of the blanket with the first pixel area can be suppressed. This enhances the emission efficiency and the element lifetime of the first pixel and enhances the reliability.

BRIEF DESCRIPTION OF THE DRAWINGS

FIGS. 6A to 6C are sectional views showing the manufacturing method shown in FIG. 5 in the step order;

FIGS. 8A and 8B are a sectional view and a plan view showing the configuration of a display device according to a second embodiment of the present disclosure;

FIG. 11 is a diagram showing the relationship between the number of places at which a lower electrode shown in FIGS. 9A to 10B is divided and the blanket accession distance to the lower electrode;

FIG. 17A is a front view of the opened state of application example 5, FIG. 17B is a side view of the opened state, FIG. 17C is a front view of the closed state, FIG. 17D is a left side view, FIG. 17E is a right side view, FIG. 17F is a top view, and FIG. 17G is a bottom view.

DETAILED DESCRIPTION OF THE PREFERRED EMBODIMENTS

Embodiments of the present disclosure will be described in detail below with reference to the drawings. The order of the description is as follows.
1. First Embodiment (example in which surface of lower electrode in blue pixel is disposed closer to substrate than those in other pixels)
2. Second Embodiment (example in which surface of lower electrode in blue pixel is divided)
3. Modification Example (example in which surface of lower electrode in blue pixel is disposed closer to substrate than those in other pixels and is divided)

First Embodiment

Configuration of Display Device 1

Figure 1:
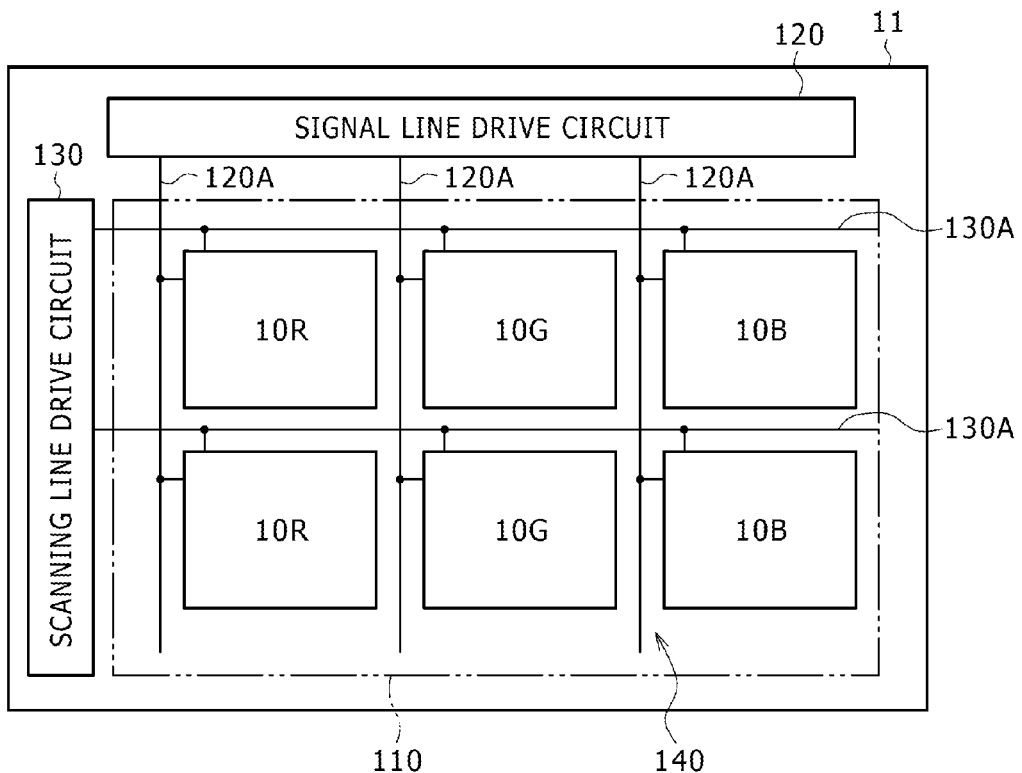
FIG. 1 is a diagram showing the configuration of a display device according to a first embodiment of the present disclosure.

FIG. 1 shows the configuration of a display device according to a first embodiment of the present disclosure (display device 1). This display device 1 is an organic electroluminescence (EL) display device. For example, over a substrate 11, plural red pixels 10R, green pixels 10G, and blue pixels 10B are disposed in a matrix manner as a display area 110. The blue pixel 10B corresponds to one specific example of the "first pixel" in the embodiment of the present disclosure, and the red pixel 10R and the green pixel 10G correspond to one specific example of the "second pixel" in the embodiment of the present disclosure. A signal line drive circuit 120 and a scanning line drive circuit 130 as drivers for video displaying are provided around the display area 110.
(Whole Configuration)

Figure 2:
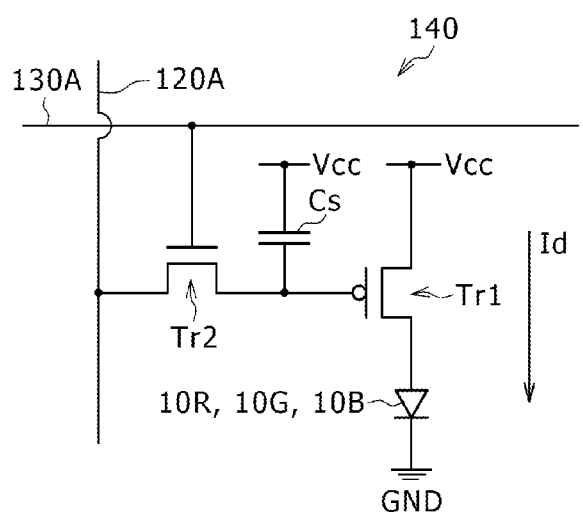
FIG. 2 is a diagram showing one example of a pixel drive circuit shown in FIG. 1.

A pixel drive circuit 140 is provided in the display area 110. FIG. 2 shows one example of the pixel drive circuit 140. The pixel drive circuit 140 is an active drive circuit formed under lower electrodes 13R, 13G, and 13B to be described later. Specifically, this pixel drive circuit 140 has a drive transistor Tr1 and a write transistor Tr2, a capacitor (hold capacitance) Cs between these transistors Tr1 and Tr2, and the red pixel 10R (or green pixel 10G, blue pixel 10B) connected in series to the drive transistor Tr1 between a first power supply line (Vcc) and a second power supply line (GND). The drive transistor Tr1 and the write transistor Tr2 are formed of a general thin film transistor (TFT). The configuration thereof may be e.g. an inverted-staggered structure (so-called bottom gate type) or a staggered structure (top gate type) and is not particularly limited.

In the pixel drive circuit 140, plural signal lines 120A are disposed along the column direction and plural scanning lines 130A are disposed along the row direction. The intersection of the signal line 120A and the scanning line 130A corresponds to one of the red pixel 10R, the green pixel 10G, and the blue pixel 10B. Each signal line 120A is connected to the signal line drive circuit 120 and an image signal is supplied from this signal line drive circuit 120 to the source electrode of the write transistor Tr2 via the signal line 120A. Each scanning line 130A is connected to the scanning line drive circuit 130 and a scanning signal is sequentially supplied from this scanning line drive circuit 130 to the gate electrode of the write transistor Tr2 via the scanning line 130A.
(Pixel)

Figure 3:
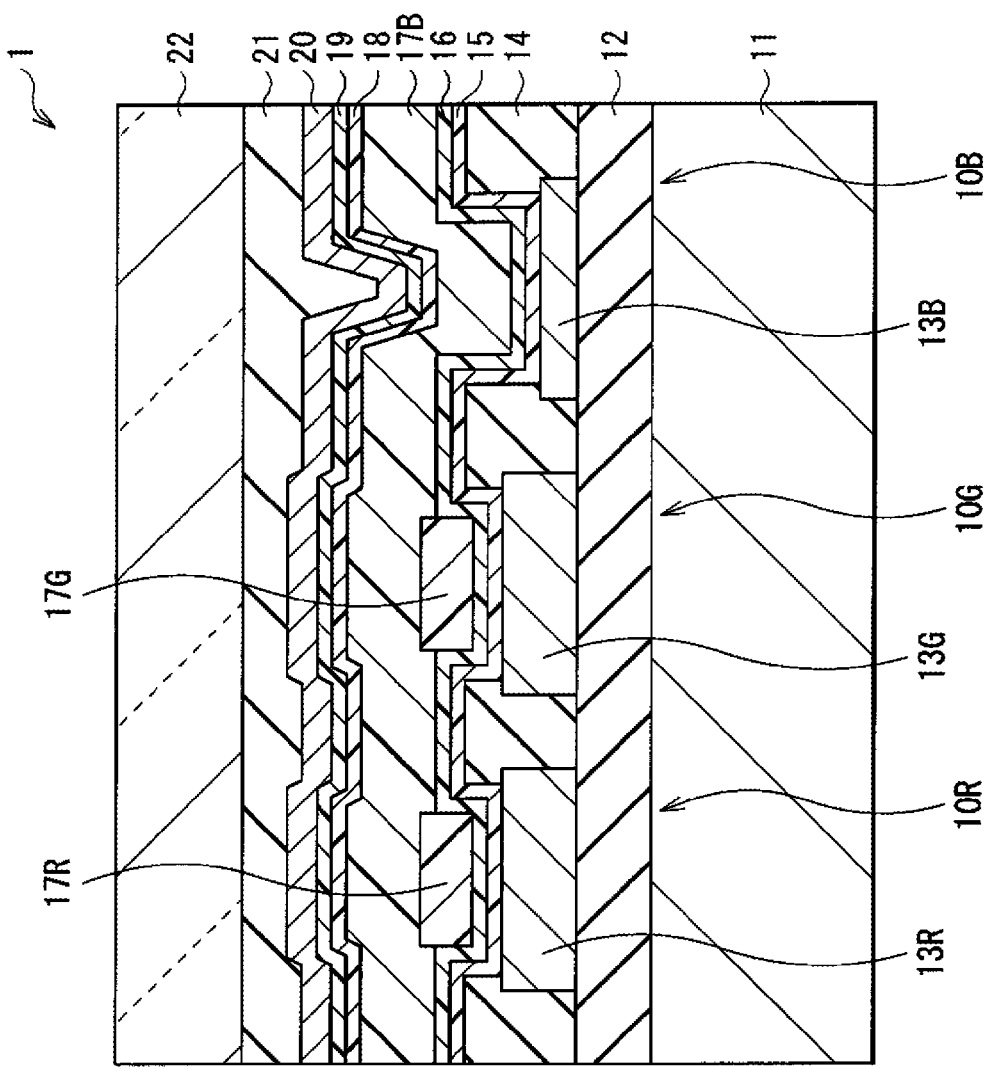
FIG. 3 is a sectional view showing the configuration of a display area shown in FIG. 1.

FIG. 3 shows the sectional configuration of the display area 110 shown in FIG. 1. Each of the red pixel 10R, the green pixel 10G, and the blue pixel 10B has a structure obtained by stacking, from the side of the substrate 11, the drive transistor Tr1 (not shown) of the pixel drive circuit 140, a planarization insulating film 12, the lower electrode 13R, 13G, or 13B as the anode, an aperture insulating film 14, a hole injection layer 15, a hole transport layer 16, a blue light emitting layer 17B, an electron transport layer 18, an electron injection layer 19, and an upper electrode 20 as the cathode in that order. In the red pixel 10R and the green pixel 10G, a red light emitting layer 17R and a green light emitting layer 17G, respectively, are provided between the hole transport layer 16 and the blue light emitting layer 17B. The blue light emitting layer 17B corresponds to one specific example of the "first light emitting layer" in the embodiment of the present disclosure, and the red light emitting layer 17R and the green light emitting layer 17G correspond to one specific example of the "second light emitting layer" in the embodiment of the present disclosure.

These red pixel 10R, green pixel 10G, and blue pixel 10B are covered by a protective layer 21 and a sealing substrate 22 composed of e.g. glass is bonded onto this protective layer 21 across the whole surface with the intermediary of an adhesion layer (not shown) formed of e.g. a heat-curable resin or an ultraviolet-curable resin.

The substrate 11 is a support body on which the red pixel 10R, the green pixel 10G, and the blue pixel 10B are arranged on its one main surface side. As the substrate 11, a publicly-known component such as a film or a sheet made of quartz, glass, metal foil, or resin may be used. Among these materials, quartz and glass are preferable. If a component made of a resin is used, the following substances can be used as its material: methacrylic resins typified by polymethylmethacrylate (PMMA); polyesters such as polyethylene terephthalate (PET), polyethylene naphthalate (PEN), and polybutylene naphthalate (PBN); and polycarbonate resins. However, in this case, it is preferable to form a multilayer structure and perform surface treatment in order to suppress water permeability and gas permeability.

The planarization insulating film 12 is to planarize the surface of the substrate 11 over which the pixel drive circuit 140 is formed. It is preferable that the planarization insulating film 12 be formed of a material having high pattern accuracy because minute connection holes (not shown) for connecting the drive transistor Tr1 to the lower electrodes 13R, 13G, and 13B are formed therein. Examples of the material of the planarization insulating film 12 include organic materials such as polyimide and inorganic materials such as silicon oxide ($SiO_2$).

The lower electrodes 13R, 13G, and 13B are provided on the planarization insulating film 12 for each of the red pixels 10R, the green pixels 10G, and the blue pixels 10B, respectively, and are composed of e.g. an elemental metal or an alloy of metal elements such as chromium (Cr), gold (Au), platinum (Pt), nickel (Ni), copper (Cu), tungsten (W), and silver (Ag). Alternatively, they may have a multilayer structure formed of the above-described metal film and a transparent electrically-conductive film. Examples of the transparent electrically-conductive film include an oxide of indium and tin (ITO), indium zinc oxide (InZnO), and an alloy of zinc oxide (ZnO) and aluminum (Al). If the lower electrodes 13R, 13G, and 13B are used as the anode, it is preferable that they be composed of a material having high hole injection ability. However, even when they are composed of a material that does not have a sufficiently high work function like an aluminum alloy, they can be made to function as the anode by providing the proper hole injection layer 15.

Figure 4A:
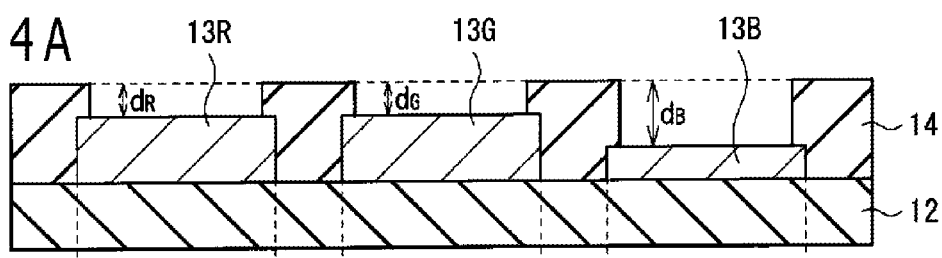
FIGS. 4A and 4B are a sectional view and a plan view showing part of pixels shown in FIG. 3.
Figure 4B:
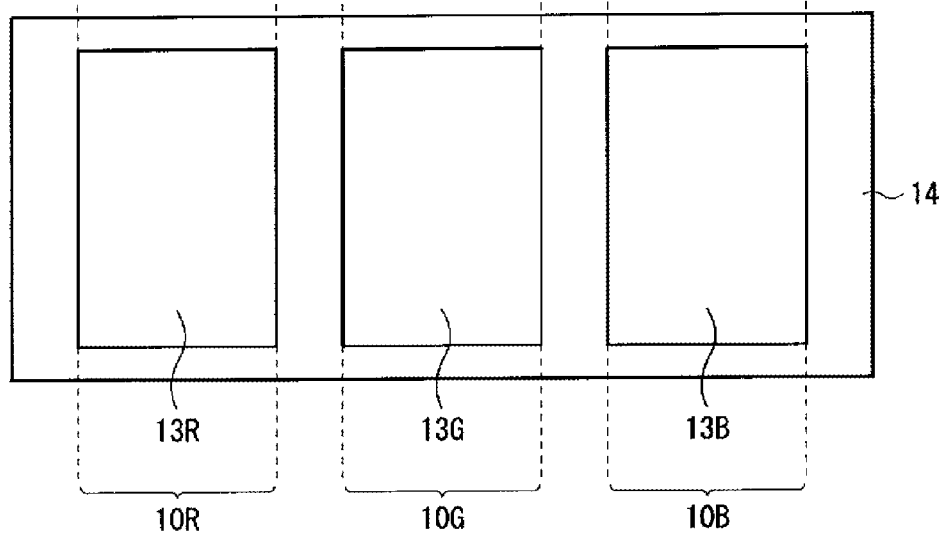

In the present embodiment, the surface of the lower electrode 13B (surface opposed to the upper electrode 20) is located closer to the substrate 11 than the surfaces of the lower electrodes 13R and 13G. FIGS. 4A and 4B show details of the lower electrodes 13R, 13G, and 13B shown in FIG. 3. FIGS. 4A and 4B are a sectional view and a plan view, respectively, of the lower electrodes 13R, 13G, and 13B. The thicknesses of the lower electrodes 13R and 13G in the layer stacking direction (hereinafter, referred to simply as the thickness) are e.g. 10 nm to 1000 nm and the distances $d_R$ and $d_G$ from the surfaces of the lower electrodes 13R and 13G to the surface of the aperture insulating film 14 are e.g. 10 nm to 3000 nm. On the other hand, the distance $d_B$ from the surface of the lower electrode 13B to the surface of the aperture insulating film 14 is e.g. 20 nm to 6000 nm. In other words, the surface of the lower electrode 13B is set lower than the surfaces of the lower electrodes 13R and 13G by e.g. 10 nm to 3000 nm. Specifically, as shown in FIG. 4A, the thickness of the lower electrode 13B is set smaller than those of the lower electrodes 13R and 13G for the position adjustment. By adjusting the position of the surface of the lower electrode 13B in this manner, a blanket can be prevented from being strongly pressed against the blue pixel 10B (surface of the hole transport layer 16 in the blue pixel 10B) in film deposition of the red light emitting layer 17R and the green light emitting layer 17G by a printing method with use of the blanket. In FIG. 4A, the example in which the surface position is adjusted based on the thickness of the lower electrode 13B is shown. However, the thickness of a layer under the lower electrode 13B, specifically e.g. the thickness of the planarization insulating film 12 in the blue pixel 10B, may be adjusted.

The aperture insulating film 14 is to ensure insulation between the lower electrodes 13R, 13G, and 13B and the upper electrode 20 and make the light emitting area have a desired shape. Apertures are provided therein corresponding to the light emitting areas. The aperture insulating film 14 is formed e.g. by stacking a photosensitive resin such as positive photosensitive polybenzoxazole or positive photosensitive polyimide on an inorganic insulating material such as $SiO_2$. The layers over the aperture insulating film 14, i.e. the layers from the hole injection layer 15 to the upper electrode 20, may be provided not only in the apertures but also over the aperture insulating film 14. However, light emission is caused only in the apertures.

The hole injection layer 15 is provided in common to the red pixel 10R, the green pixel 10G, and the blue pixel 10B. It enhances the hole injection efficiency and has a function as a buffer layer to prevent leakage. It is preferable that this hole injection layer 15 be formed with a thickness of e.g. 5 nm to 100 nm, and it is more preferable that the thickness be 8 nm to 50 nm.

Examples of the material of the hole injection layer 15 include polyaniline, polythiophene, polypyrrole, polyphenylene, polythienylenevinylene, polyquinoline, polyquinoxaline, and derivatives of them, electrically-conductive polymers such as a polymer including an aromatic amine structure in the main chain or the side chain, metal phthalocyanine (such as copper phthalocyanine), and carbon. The material is appropriately selected depending on the relationship with the materials of the electrode and adjacent layer.

If the hole injection layer 15 is composed of a polymer material, the weight-average molecular weight (Mw) is e.g. about 2000 to 300000 and preferably about 5000 to 200000. If Mw is lower than 5000, possibly the hole injection layer 15 is dissolved in forming the hole transport layer 16 and the subsequent layers. If Mw surpasses 300000, possibly the film deposition becomes difficult due to material gelatinization.

Examples of the typical polymer material used for the hole injection layer 15 include polyaniline and/or oligoaniline and polydioxythiophene such as poly(3,4-ethylenedioxythiophene) (PEDOT). Specifically, e.g. the following materials can be used: a product with a name of Nafion (trademark) and a product with a name of Liquion (trademark) made by H.C. Starck Ltd., a product with a name of ELsource (trademark) made by Nissan Chemical Industries, Ltd., and an electrically-conductive polymer Berazol made by Soken Chemical & Engineering Co., Ltd.

The hole transport layer 16 is to enhance the efficiency of hole transportation to the red light emitting layer 17R, the green light emitting layer 17G, and the blue light emitting layer 17B, and is provided on the hole injection layer 15 in common to the red pixel 10R, the green pixel 10G, and the blue pixel 10B.

The thickness of the hole transport layer 16 is e.g. preferably 10 nm to 200 nm and more preferably 15 nm to 150 nm, although depending on the whole configuration of the element. As the polymer material to configure the hole transport layer 16, a light emitting material that is soluble in an organic solvent is used. Examples of the material include polyvinylcarbazole and derivatives thereof, polyfluorene and derivatives thereof, polyaniline and derivatives thereof, polysilane and derivatives thereof, polysiloxane derivatives having aromatic amine in the side chain or the main chain, polythiophene and derivatives thereof, and polypyrrole.

The weight-average molecular weight (Mw) of the polymer material is e.g. about 50000 to 300000 and preferably about 100000 to 200000 particularly. If Mw is lower than 50000, a low-molecular component in the polymer material drops off in forming the light emitting layer and dots are generated in the hole injection and transport layers. Thus, possibly the initial performance of the organic EL element is lowered and the deterioration of the element is caused. If Mw surpasses 300000, possibly the film deposition becomes difficult due to material gelatinization.

The weight-average molecular weight (Mw) is the value defined by obtaining the weight-average molecular weight in terms of polystyrene by gel permeation chromatography (GPC) with use of tetrahydrofuran as the solvent.

The red light emitting layer 17R and the green light emitting layer 17G are to generate light through the occurrence of recombination of electron and hole by application of an electric field, and are provided for each of the red pixels 10R and the green pixels 10G, respectively. The thickness of the red light emitting layer 17R and the green light emitting layer 17G is e.g. preferably 10 nm to 200 nm and more preferably 15 nm to 150 nm, although depending on the whole configuration of the element. Examples of the polymer material to configure the red light emitting layer 17R and the green light emitting layer 17G include polyfluorene-based polymer derivatives, (poly)paraphenylenevinylene derivatives, polyphenylene derivatives, polyvinylcarbazole derivatives, polythiophene derivatives, perylene-based dyes, coumarin-based dyes, rhodamine-based dyes, and substances obtained by doping the above-described polymers with an organic EL material. Specifically, the material can be used by doping it with e.g. rubrene, perylene, 9,10-diphenylanthracene, tetraphenylbutadiene, nile red, or coumarin 6.

The blue light emitting layer 17B is to generate light through the occurrence of recombination of electron and hole by application of an electric field, and is provided as a common layer on the red light emitting layer 17R, the green light emitting layer 17G, and the hole transport layer 16 in the blue pixel 10B. That is, the blue light emitting layer 17B is provided in common to the red pixel 10R, the green pixel 10G, and the blue pixel 10B. The blue light emitting layer 17B is obtained e.g. by doping an anthracene compound as the host material with a blue or green organic light emitting material such as low-molecular fluorescent dye, phosphorescent dye, or metal complex as the guest material, and emits blue or green light.

The electron transport layer 18 is to enhance the efficiency of electron transportation to the red light emitting layer 17R, the green light emitting layer 17G, and the blue light emitting layer 17B, and is provided as a common layer over the whole surface of the blue light emitting layer 17B. Examples of the material of the electron transport layer 18 include quinoline, perylene, phenanthroline, phenanthrene, pyrene, bisstyryl, pyrazine, triazole, oxazole, fullerene, oxadiazole, fluorenone, anthracene, naphthalene, butadiene, coumarin, acridine, stilbene and derivatives and metal complexes of them. Specifically, e.g. tris(8-hydroxyquinoline)aluminum (abbreviation, $Alq_3$) can be used.

The electron injection layer 19 is to enhance the electron injection efficiency and is provided as a common layer over the whole surface of the electron transport layer 18. As the material of the electron injection layer 19, e.g. lithium oxide ($Li_2O$), which is an oxide of lithium (Li), cesium carbonate ($Cs_2CO_3$), which is a composite oxide of cesium, or a mixture of them can be used. Furthermore, an elemental metal or an alloy of the following metals may be used: alkaline earth metals such as calcium (Ca) and barium (Ba), alkali metals such as lithium and cesium, and metals having a low work function, such as indium (In) and magnesium. Alternatively, a single substance or a mixture of oxides, composite oxides, and fluorides of these metals may be used.

The upper electrode 20 is provided on the electron injection layer 19 across the whole surface in such a manner as to be insulated from the lower electrodes 13R, 13G, and 13B. That is, the upper electrode 20 serves as a common electrode of the red pixel 10R, the green pixel 10G, and the blue pixel 10B. The upper electrode 20 is formed of e.g. a metal electrically-conductive film having a thickness of 3 nm to 8 nm. Specifically, it is composed of e.g. an alloy containing aluminum (Al), magnesium, calcium, or sodium (Na). In particular, an alloy of magnesium and silver (Mg—Ag alloy) is preferable because it has favorable optical transparency and electrical conductivity. The ratio of magnesium to silver is not particularly limited but it is preferable that the film thickness ratio of Mg:Ag fall within the range of 20:1 to 1:1. An alloy of aluminum and lithium (Al—Li alloy) may be used for the upper electrode 20.

The upper electrode 20 may be formed of a mixed layer containing an organic light emitting material such as aluminum-quinoline complex, styryl amine derivative, or phthalocyanine derivative. In this case, the upper electrode 20 may additionally include a layer having optical transparency like a Mg—Ag alloy layer as the third layer.

(Protective Layer and Sealing Substrate)

The protective layer 21 may be configured by either an insulating material or an electrically-conductive material and is formed with a thickness of e.g. 2 μm to 3 μm. For example, an inorganic amorphous insulating material such as amorphous silicon (α-Si), amorphous silicon carbide (α-SiC), amorphous silicon nitride ($\alpha\text{-Si}_{1-x}N_x$), or amorphous carbon (α-C) can be used. Such a material forms no grain and thus has low water permeability. Therefore, a favorable protective film is obtained.

The sealing substrate 22 is located on the side of the upper electrode 20 of the red pixel 10R, the green pixel 10G, and the blue pixel 10B and is to seal the red pixel 10R, the green pixel 10G, and the blue pixel 10B together with the adhesion layer (not shown). The sealing substrate 22 is composed of e.g. glass.

The sealing substrate 22 is provided with e.g. color filters and a light blocking film as a black matrix (neither is shown). Due to this configuration, light generated in the red pixel 10R, the green pixel 10G, and the blue pixel 10B is extracted. In addition, ambient light reflected by the red pixel 10R, the green pixel 10G, the blue pixel 10B, and interconnects among them is absorbed. Thus, favorable contrast is obtained.

As the color filters, red filter, green filter, and blue filter are disposed in turn corresponding to the red pixel 10R, the green pixel 10G, and the blue pixel 10B, respectively. The red filter, the green filter, and the blue filter each have e.g. a rectangular shape and are formed without gaps. These color filters are composed of a resin containing a pigment. By appropriately selecting the pigment, adjustment can be so carried out that the optical transmittance in the intended red, green, or blue wavelength region becomes high whereas the optical transmittance in the other wavelength region becomes low.

The light blocking film is formed of e.g. a black resin film that contains a black colorant and has optical density of at least 1 or a thin film filter utilizing thin film interference. The black resin film is preferable because it can be easily formed at low cost. The thin film filter has at least one layer of a thin film composed of e.g. a metal, a metal nitride, or a metal oxide and is to attenuate light by utilizing the interference of the thin film. Specifically, a component obtained by alternately stacking chromium and chromium oxide (III) ($Cr_2O_3$) can be used.

[Manufacturing Method of Display Device 1]

Figure 5:
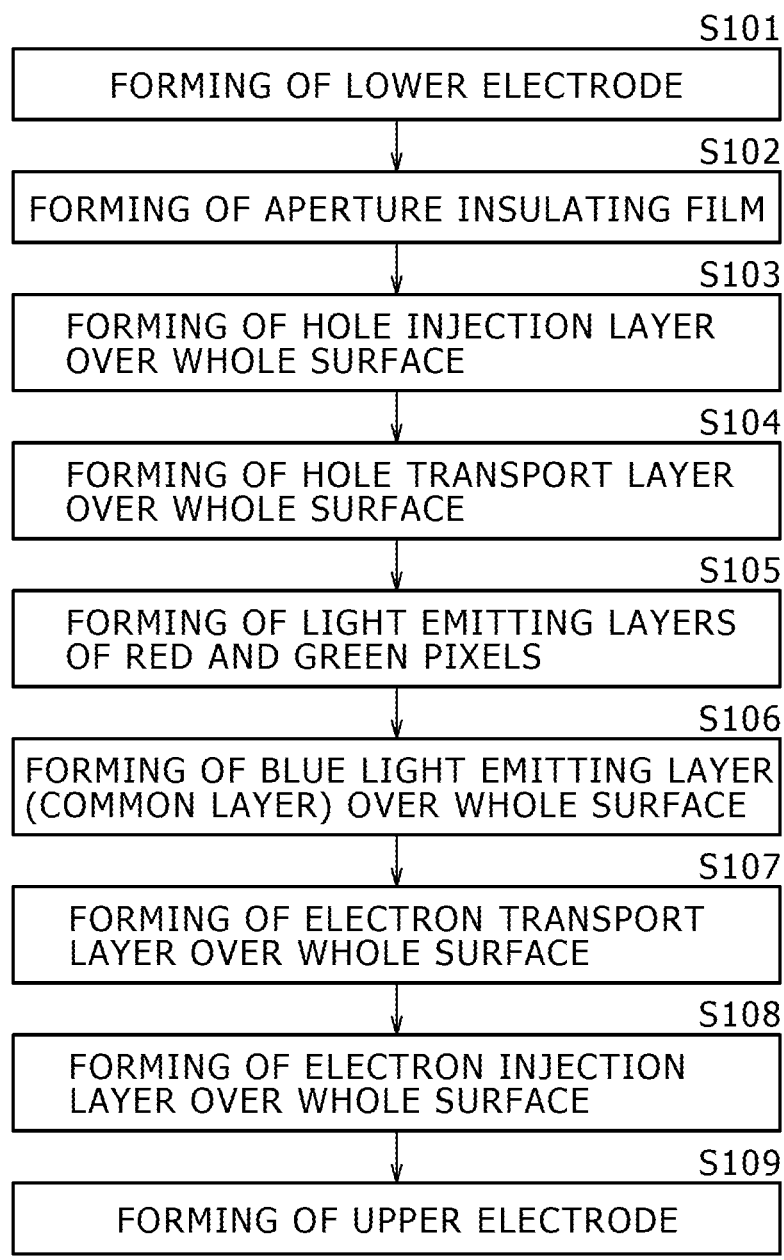
FIG. 5 is a diagram showing the flow of a manufacturing method of the display device shown in FIG. 1.

FIG. 5 shows the flow of a manufacturing method of the display device 1 according to the present embodiment. FIGS. 6A to 6F are sectional views showing the manufacturing method shown in FIG. 5 in the step order. The manufacturing method will be described step by step below.

(Forming Step of Lower Electrodes 13R, 13G, 13B)

First, the pixel drive circuit 140 including the drive transistor Tr1 is formed on the substrate 11 composed of the above-described material, and the planarization insulating film 12 composed of e.g. a photosensitive resin is provided. Subsequently, a transparent electrically-conductive film composed of e.g. ITO is formed over the whole surface of the substrate 11 and this electrically-conductive film is patterned. At this time, as shown in FIG. 6A, the lower electrode 13B in the blue pixel 10B is so formed as to be thinner than the lower electrodes 13R and 13G by about 10 to 3000 nm by depositing the lower electrode 13B separately from the lower electrodes 13R and 13G. Furthermore, the lower electrodes 13R, 13G, and 13B are electrically connected to the drain electrodes of the drive transistors Tr1 via contact holes (not shown) in the planarization insulating film 12 (step S101).

(Forming Step of Aperture Insulating Film 14)

Subsequently, an inorganic insulating material such as $SiO_2$ is deposited on the lower electrodes 13R, 13G, and 13B and on the planarization insulating film 12 by e.g. chemical vapor deposition (CVD) and the deposited material is patterned. Furthermore, a photosensitive resin is stacked to form the aperture insulating film 14 (step S102).

After the aperture insulating film 14 is formed, oxygen plasma treatment is performed for the surface of the substrate 11, i.e. the surface on the side on which the lower electrodes 13R, 13G, and 13B and the aperture insulating film 14 are formed. Thereby, contamination such as organic substances adhering to the surface is removed to enhance the wettability.
(Forming Steps of Hole Injection Layer 15 and Hole Transport Layer 16)

After water-repellent treatment is performed, the hole injection layer 15 and the hole transport layer 16 composed of the above-described material are formed in common to the red pixel 10R, the green pixel 10G, and the blue pixel 10B as shown in FIG. 6B (steps S103 and S104). For example, the hole injection layer 15 and the hole transport layer 16 composed of the above-described material are deposited in that order by an evaporation method over the lower electrodes 13R, 13G, and 13B and over the aperture insulating film 14.
(Forming Steps of Red Light Emitting Layer 17R and Green Light Emitting Layer 17G)

After the hole transport layer 16 is formed, the red light emitting layer 17R and the green light emitting layer 17G are formed on the hole transport layer 16 of the red pixel 10R and the green pixel 10G, respectively (step S105). The display device of the present embodiment has a characteristic in this step particularly. This point will be described below.

Figure 6D:
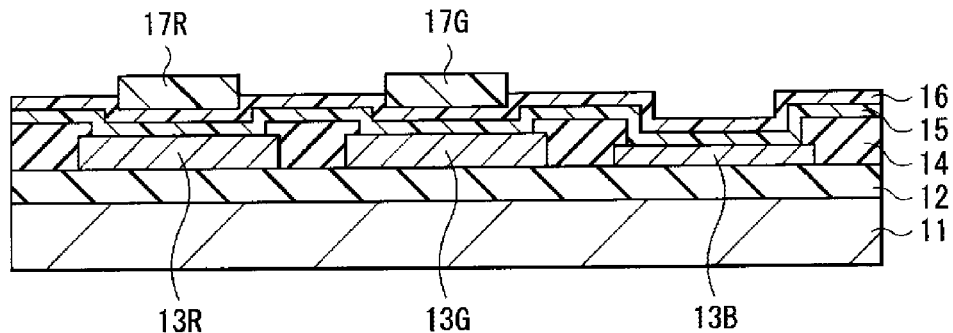
FIGS. 6D to 6F are sectional views showing steps subsequent to FIG. 6C.

For example, the red light emitting layer 17R and the green light emitting layer 17G are formed by an offset reverse printing system as shown in FIG. 6C. Specifically, first, a pattern of the material to configure the above-described red light emitting layer 17R is formed on a blanket 3 by using a plate (not shown). Subsequently, the blanket 3 is brought into contact with the substrate 11 over which the layers to the hole transport layer 16 have been formed by pressurization compression. Thereby, as shown in FIG. 6D, the red light emitting layer 17R is transferred to the area of the red pixel 10R. A similar step is carried out also for the green light emitting layer 17G. The blanket 3 is composed of e.g. a base 30 formed of glass or a metal and a soft material layer 31 formed of polydimethylsiloxane. A pattern of a printing material containing a low-polarity solvent is formed on the soft material layer 31.

Figure 7A:
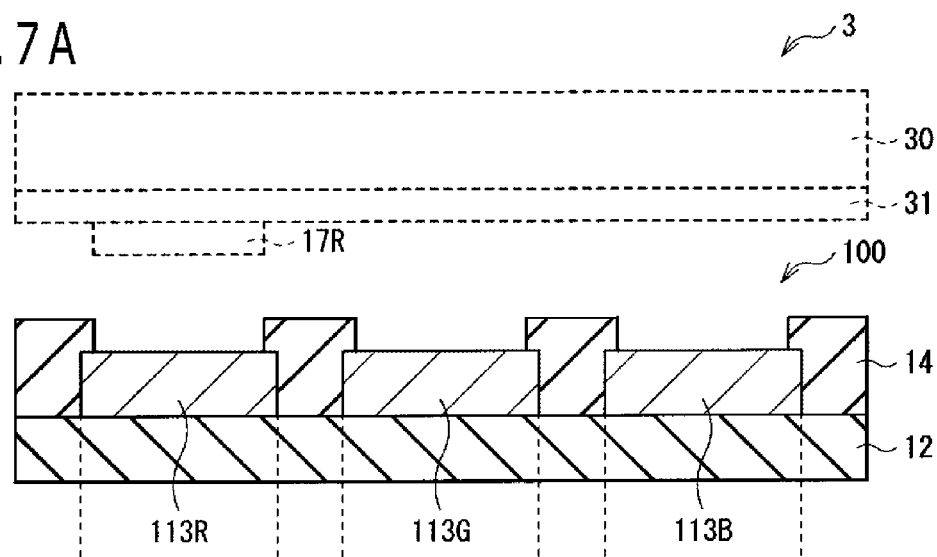
FIGS. 7A and 7B are a sectional view and a plan view showing part of pixels according to a comparative example.
Figure 7B:
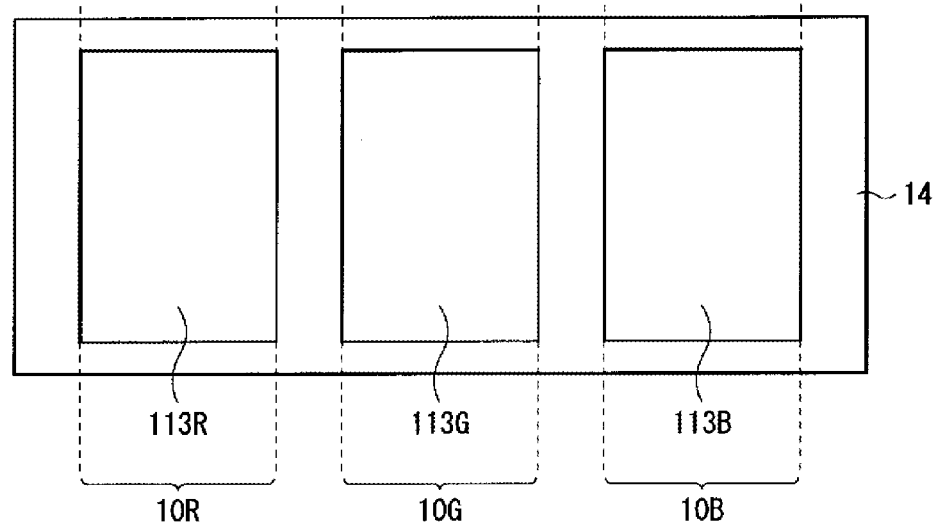

FIGS. 7A and 7B show part of a sectional view of a display device 100 in which all of lower electrodes 113R, 113G, and 113B are formed with the same thickness as a comparative example. FIGS. 7A and 7B show sectional view and plan view, respectively, of the lower electrodes 113R, 113G, and 113B. In this display device 100, in forming the red light emitting layer 17R by a printing method with use of the blanket, the soft material layer 31 of the blanket 3 gets contact with the area of the blue pixel 10B (e.g. hole transport layer 16 in the blue pixel 10B) because all of the lower electrodes 113R, 113G, and 113B in the red pixel 10R, the green pixel 10G, and the blue pixel 10B are formed with the same thickness. Thus, the material of the soft material layer 31, specifically e.g. siloxane, is transferred to the blue pixel 10B. This acts on the blue light emitting layer 17B and affects the emission efficiency, the element lifetime, and so forth in the blue pixel 10B. For example, the emission efficiency and the element lifetime in the blue pixel 10B of the display device 100 are lowered by about 10% compared with an element in which the red light emitting layer and the green light emitting layer are formed by evaporation.

In contrast, in the present embodiment, the lower electrode 13B in the blue pixel 10B is so formed as to be thinner than the lower electrodes 13R and 13G in the red pixel 10R and the green pixel 10G. Therefore, strong contact of the blanket 3 with the area in which the blue pixel 10B is to be formed (hole transport layer 16 in the blue pixel 10B) is suppressed. Thus, the lowering of the emission efficiency and the lifetime in the blue pixel 10B can be suppressed.
(Forming Step of Blue Light Emitting Layer 17B)

Figure 6E:
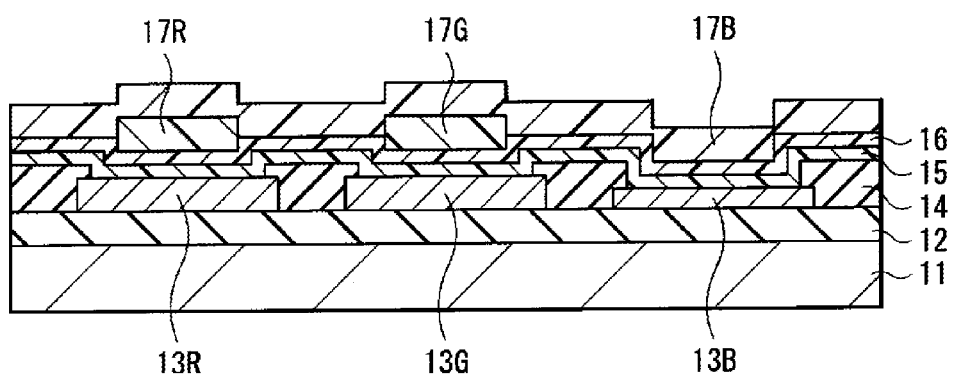

After the red light emitting layer 17R and the green light emitting layer 17G are formed, as shown in FIG. 6E, the blue light emitting layer 17B composed of the above-described material is formed as a common layer by e.g. an evaporation method over the whole surface of the red light emitting layer 17R, the green light emitting layer 17G, and the hole transport layer 16 in the blue pixel 10B (step S106).
(Forming Steps of Electron Transport Layer 18, Electron Injection Layer 19, and Upper Electrode 20)

Figure 6F:
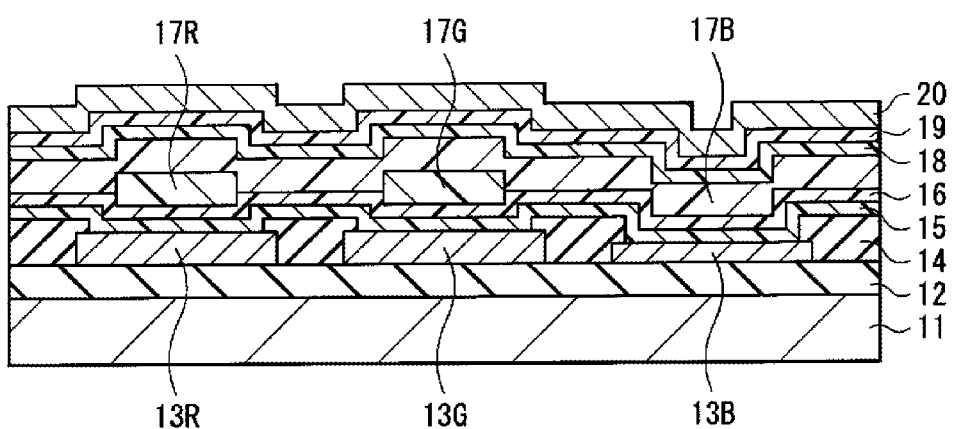

After the blue light emitting layer 17B is formed, as shown in FIG. 6F, the electron transport layer 18, the electron injection layer 19, and the upper electrode 20 composed of the above-described materials are formed by e.g. an evaporation method over the whole surface of this blue light emitting layer 17B (steps S107, S108, and S109).

After the upper electrode 20 is formed, the protective layer 21 is formed by e.g. an evaporation method or a CVD method as shown in FIG. 3. At this time, it is preferable to set the film deposition temperature to an ordinary temperature in order to prevent luminance lowering accompanying the deterioration of the red light emitting layer 17R, the green light emitting layer 17G, the blue light emitting layer 17B, and so forth. In addition, it is preferable to perform the film deposition under such a condition as to minimize the stress of the film in order to prevent delamination of the protective layer 21.

The blue light emitting layer 17B, the electron transport layer 18, the electron injection layer 19, the upper electrode 20, and the protective layer 21 are formed across the whole surface without using a mask. These layers are so-called blanket films. Furthermore, it is preferable that the blue light emitting layer 17B, the electron transport layer 18, the electron injection layer 19, the upper electrode 20, and the protective layer 21 be successively formed in the same film deposition apparatus without being exposed to the air. This is because deterioration due to water in the air is prevented.

If an auxiliary electrode (not shown) is formed in the same step as that of the lower electrodes 13R, 13G, and 13B, the layers from the hole injection layer 15 to the electron injection layer 19 formed above the auxiliary electrode may be removed by e.g. laser ablation before the upper electrode 20 is formed. This connects the upper electrode 20 directly to the auxiliary electrode and can improve the contact.

After the protective layer 21 is formed, the sealing substrate 22 is bonded over the protective layer 21 with the intermediary of the adhesion layer (not shown). A light blocking film and color filters composed of the above-described materials are formed on the sealing substrate 22 in advance. Through the above-described steps, the display device 1 shown in FIG. 1 to FIG. 3 is completed.
[Operation and Effects of Display Device 1]

In this display device 1, the scanning signal is supplied from the scanning line drive circuit 130 to the respective pixels via the gate electrode of the write transistor Tr2 and the image signal from the signal line drive circuit 120 is held in the hold capacitance Cs via the write transistor Tr2. That is, the drive transistor Tr1 is on/off-controlled depending on the signal held in this hold capacitance Cs. Thereby, a drive current Id is injected to the red pixel 10R, the green pixel 10G, and the blue pixel 10B and light emission occurs due to recombination of hole and electron. In the case of the lower-surface light emission (bottom emission), this light is extracted after being transmitted through the lower electrodes 13R, 13G, and 13B and the substrate 11. In the case of the upper-surface light emission (top emission), the light is extracted after being transmitted through the upper electrode 20, the color filters (not shown), and the sealing substrate 22.

In this light emission, in the red pixel 10R, in which the red light emitting layer 17R and the blue light emitting layer 17B are provided, energy shift to red, whose energy level is the lowest, occurs and red light emission (wavelength 620 nm to 750 nm) is dominant. In the green pixel 10G, in which the green light emitting layer 17G and the blue light emitting layer 17B are provided, energy shift to green, whose energy level is the lower, occurs and green light emission (wavelength 495 nm to 570 nm) is dominant. In the blue pixel 10B, blue light emission (wavelength 450 nm to 495 nm) occurs because it has only the blue light emitting layer 17B. In this display device 1, the lower electrode 13B in the blue pixel 10B is so formed as to be thinner than the lower electrodes 13R and 13G in the red pixel 10R and the green pixel 10G. Therefore, strong contact of the blanket 3 with the area of the blue pixel 10B is avoided in the forming steps of the red light emitting layer 17R and the green light emitting layer 17G. This suppresses transfer of the material configuring the soft material layer 31 of the blanket 3, specifically e.g. siloxane, to the blue pixel 10B.

As described above, in the present embodiment, the surface of the lower electrode 13B in the blue pixel 10B is set closer to the substrate 11 than the surfaces of the lower electrodes 13R and 13G in the red pixel 10R and the green pixel 10G. Therefore, strong contact of the blanket 3 with the blue pixel 10B can be suppressed in depositing the red light emitting layer 17R and the green light emitting layer 17G by use of the blanket 3. This allows enhancement in the reliability of the display device 1, such as enhancement in the emission efficiency, the element lifetime, and so forth of the blue pixel 10B.

The organic EL display device in which the light emitting layer is deposited by a printing method is excellent in view of the cost and the environmental burden and is desired to be realized early. However, it involves a problem in the characteristics of the blue light emitting layer material suitable for the printing method. However, by providing the blue light emitting layer 17B as a common layer like in the display device 1, film deposition of the blue light emitting layer 17B by an evaporation method is permitted. Furthermore, by disposing the surface of the lower electrode 13B of the blue pixel 10B closer to the substrate, the influence on the blue pixel 10B in the film deposition steps of the red light emitting layer 17R and the green light emitting layer 17G can be suppressed.

A second embodiment of the present disclosure and a modification example thereof will be described below. In the following description, the same constituent part as that in the above-described embodiment is given the same numeral and explanation thereof is accordingly omitted.

Second Embodiment

A display device according to the second embodiment of the present disclosure (display device 2) is different from the above-described first embodiment in that the surface of a lower electrode 23B of the blue pixel 10B is divided into at least two regions by an insulator.

FIG. 8A and FIG. 8B show sectional configuration and planar configuration, respectively, of lower electrodes 23R, 23G, and 23B in the red pixel 10R, the green pixel 10G, and the blue pixel 10B. Among these lower electrodes, the lower electrode 23B in the blue pixel 10B has a surface divided into three regions 23Ba, 23Bb, and 23Bc. The area of each of the regions 23Ba, 23Bb, and 23Bc is smaller than the area of the surface of the lower electrodes 23R and 23G in the red pixel 10R and the green pixel 10G. In other words, the light emitting area of the blue pixel 10B is composed of three regions 10Ba, 10Bb, and 10Bc having an area smaller than that of the red pixel 10R and the green pixel 10G.

The aperture insulating film 14 is provided between the region 23Ba and the region 23Bb and between the region 23Bb and the region 23Bc. That is, the surface of the lower electrode 23B is divided by the aperture insulating film 14. For example, the regions 23Ba, 23Bb, and 23Bc each have a substantially rectangular shape with a vertical length of 60 µm and a horizontal length of 50 µm, and distance of about 10 µm exists between the region 23Ba and the region 23Bb and between the region 23Bb and the region 23Bc. Due to this division of the lower electrode 23B by the aperture insulating film 14, strong contact of the blanket 3 with the blue pixel 10B is avoided when the blanket 3 is brought into contact with the substrate 11 over which the layers to the hole transport layer 16 have been formed by pressurization compression (this state is equivalent to that of FIG. 6C) in the film deposition steps of the red light emitting layer 17R and the green light emitting layer 17G. Specifically, the blanket 3 gets contact with the part that makes the division into the regions 23Ba, 23Bb, and 23Bc (area in which the aperture insulating film 14 is formed). Thus, the strong contact with the blue pixels 10Ba, 10Bb, and 10Bc can be suppressed. The lower electrode 23B is one electrode and is not divided except for the surface.

For example, the lower electrode 23B whose surface is divided into the regions 23Ba, 23Bb, and 23Bc is formed by patterning of the aperture insulating film 14.

Although the example in which the lower electrode 23B is divided into three regions 23Ba, 23Bb, and 23Bc is shown in FIG. 8, it may be divided into two regions. Alternatively, it may be into at least four regions. Furthermore, although the example in which the lower electrode 23B having a substantially rectangular shape is divided in its long-side direction is shown in FIG. 8, it may be divided in the short-side direction. Alternatively, it may be divided in an oblique direction. Moreover, the thickness of the lower electrodes 23Ba, 23Bb, and 23Bc may be the same as that of the lower electrodes 23R and 23G, and the thicknesses of the lower electrodes 23Ba, 23Bb, and 23Bc may be identical to each other or may be different from each other.

Modification Example

In a display device according to a modification example of the above-described embodiment, the surface of the lower electrode 23B in the blue pixel 10B is divided into at least two regions. In addition, the surface of the lower electrode 23B is located closer to the substrate 11 than the surfaces of the lower electrodes 23R and 23G in the red pixel 10R and the green pixel 10G. That is, this display device has both the characteristic part of the above-described first embodiment and the characteristic part of the second embodiment.

FIG. 11 shows the result of calculation of the condition under which the blanket 3 does not get contact with the blue pixel 10B in the film deposition steps of the red light emitting layer 17R and the green light emitting layer 17G by finite element method simulation and so forth. In FIG. 11, the abscissa indicates the number of places at which the surface of the lower electrode 23B is divided and the ordinate indicates the ratio of the blanket accession distance to the lower electrode 23B to the blanket accession distances to the lower electrodes 23R and 23G (distances $d_R$ and $d_G$ in FIGS. 9A to 10B to be described later) when the distances $d_R$ and $d_G$ are defined as 50% (dashed line). The calculation was performed based on the assumption that the surfaces of the red pixel 10R, the green pixel 10G, and the blue pixel 10B each had a substantially rectangular shape with an aspect ratio of 4 to 1. The result of FIG. 11 will be described below with use of FIGS. 9A to 10B, which show schematic diagrams of the configuration of the lower electrodes 23R, 23G, and 23B.

Figure 9A:
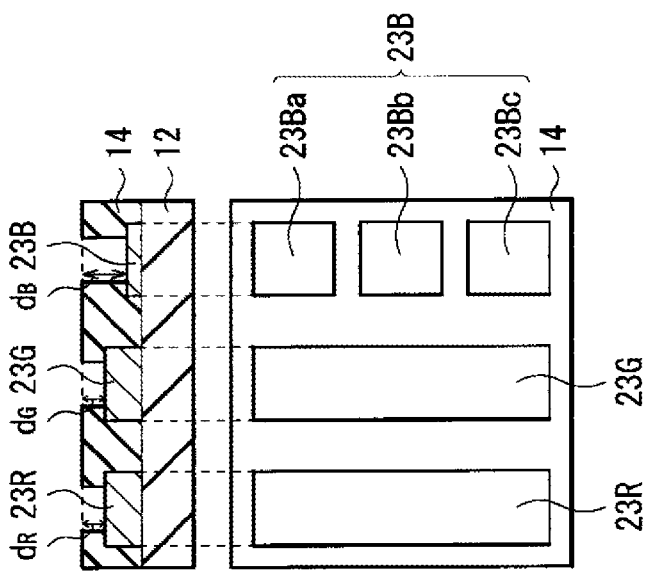
FIGS. 9A to 9C are diagrams showing part of the configurations of display devices according to a modification example of the present disclosure.
Figure 9B:
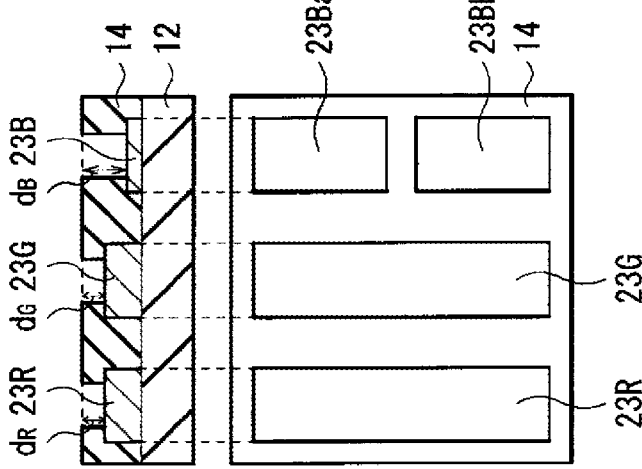
Figure 9C:
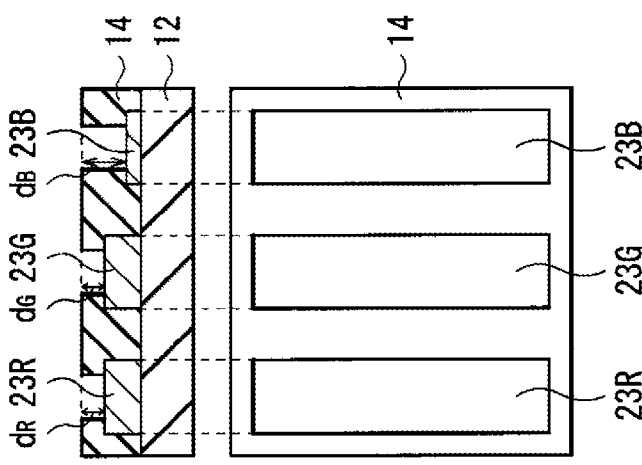
Figure 10A:
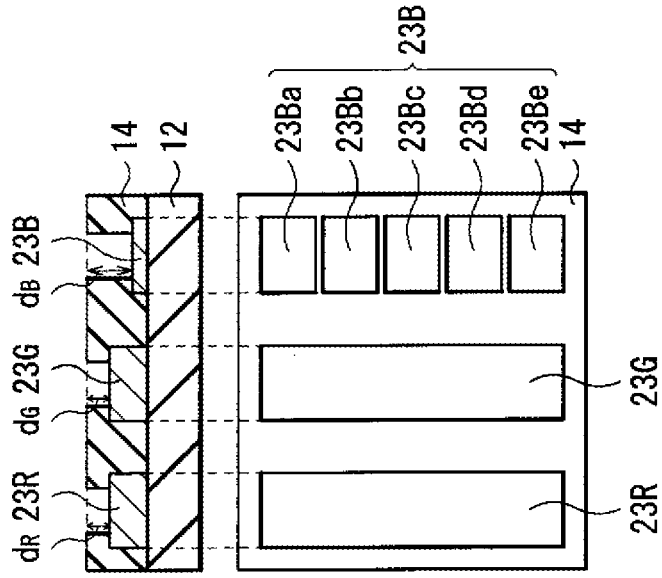
FIGS. 10A and 10B are diagrams showing part of the configurations of display devices according to the modification example of the present disclosure.

In the state in which the surface of the lower electrode 23B is not divided at all as shown in FIG. 9A, the blanket 3 does not get contact with the blue pixel 10B when distance $d_B$ from the surface of the lower electrode 23B to the surface of the aperture insulating film 14 is twice the distances $d_R$ and $d_G$ (100%). That is, if the distances $d_R$ and $d_G$ are e.g. 50 nm, the contact between the blue pixel 10B and the blanket 3 is completely avoided when the distance $d_B$ is 100 nm, i.e. when the surface of the lower electrode 23B is disposed closer to the substrate 11 by 50 nm than the surfaces of the lower electrodes 23R and 23G. On the other hand, if the surface of the lower electrode 23B is divided at one place as shown in FIG. 9B, i.e. if the lower electrode 23B is composed of regions 23Ba and 23Bb, it is enough for the distance $d_B$ to be 91% (91 nm). Similarly, if the lower electrode 23B is divided at two places and at three places as shown in FIG. 9C and FIG. 10A, the distance $d_B$ is 73% (73 nm) and 57% (57 nm), respectively.

Figure 10B:
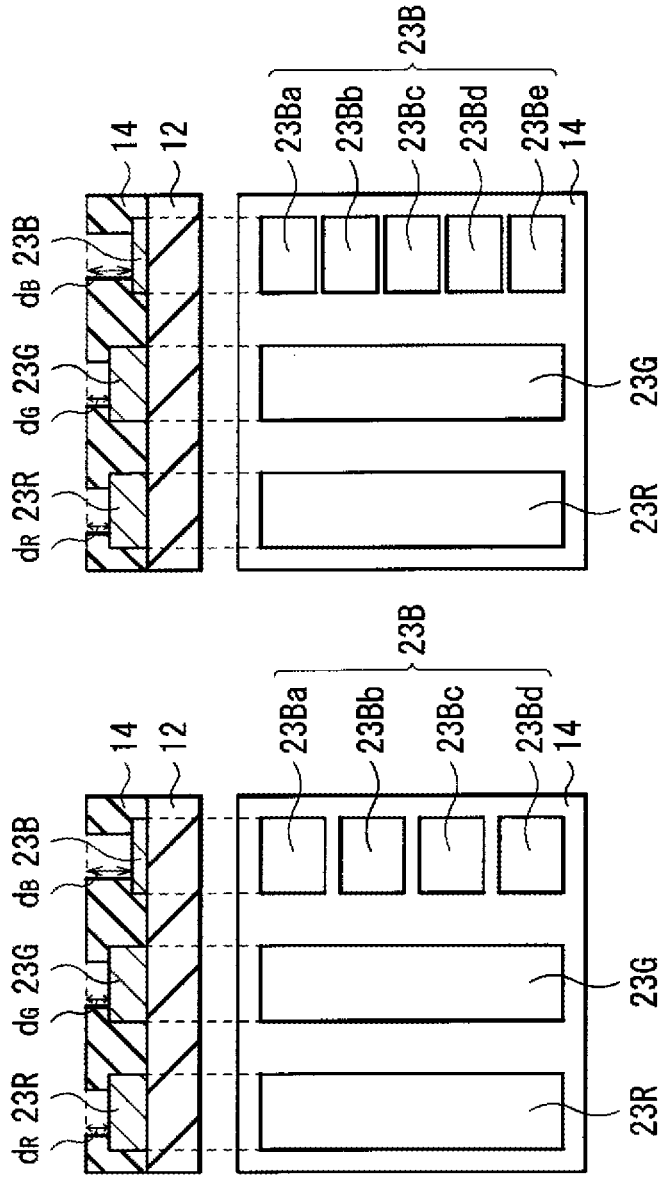

Moreover, if the lower electrode 23B is divided at four places as shown in FIG. 10B, i.e. if the lower electrode 23B is composed of regions 23Ba, 23Bb, 23Bc, 23Bd, and 23Be, the blanket 3 does not get contact with the blue pixel 10B at all even when the distances $d_R$ and $d_G$ are the same as the distance $d_B$, i.e. even when the position of the surfaces of the lower electrodes 23R and 23G is the same as that of the surface of the lower electrode 23B relative to the substrate 11.

As just described, by dividing the surface of the lower electrode 23B in the blue pixel 10B into at least two regions and disposing the surface of the lower electrode 23B closer to the substrate 11 than the surfaces of the lower electrodes 23R and 23G of the red pixel 10R and the green pixel 10G, strong contact of the blanket 3 with the blue pixel 10B can be prevented more effectively.

MODULE AND APPLICATION EXAMPLES

Application examples of the display device explained in the above-described embodiments and modification example will be described below. The display device of the above-described embodiments and so forth can be applied to a display device in electronic apparatus in every field that displays a video signal input from the external or a video signal generated inside as image or video, such as television devices, digital cameras, notebook personal computers, portable terminal devices typified by cellular phones, and video camcorders.

(Module)

Figure 12:
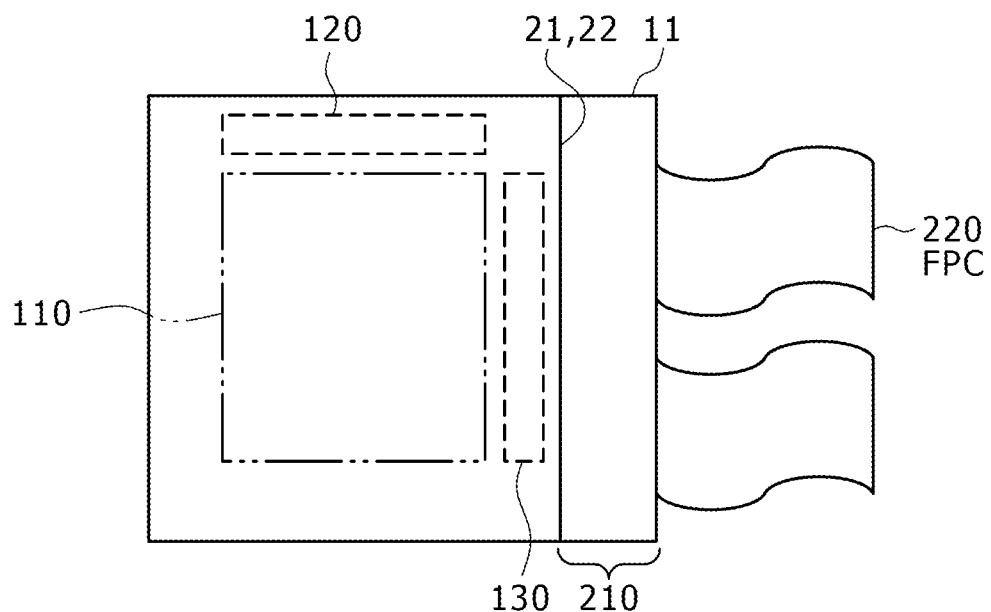
FIG. 12 is a plan view showing the schematic configuration of a module including the display device of the above-described embodiment.

The display device of the above-described embodiments and so forth is incorporated into various pieces of electronic apparatus such as application examples 1 to 5 to be described later as a module shown in FIG. 12 for example. This module is obtained e.g. by setting an area 210 exposed from the protective layer 21 and the sealing substrate 22 along one side of the substrate 11 and forming an external connection terminal (not shown) in this exposed area 210 by extending the wiring of the signal line drive circuit 120 and the scanning line drive circuit 130. The external connection terminal may be provided with a flexible printed circuit (FPC) 220 for signal input/output.

Application Example 1

Figure 13:
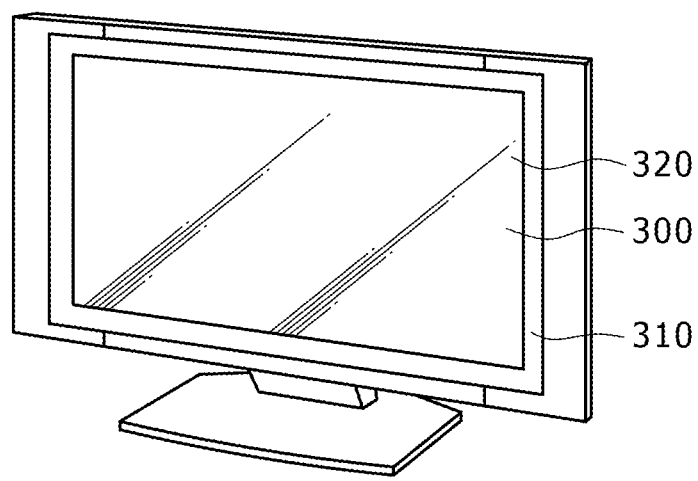
FIG. 13 is a perspective view showing the appearance of application example 1 of the display device of the above-described embodiment.

FIG. 13 shows the appearance of a television device to which the display device of the above-described embodiments and so forth is applied. This television device has e.g. a video display screen section 300 including a front panel 310 and a filter glass 320, and this video display screen section 300 is configured by the display device according to the above-described embodiments and so forth.

Application Example 2

Figure 14A:
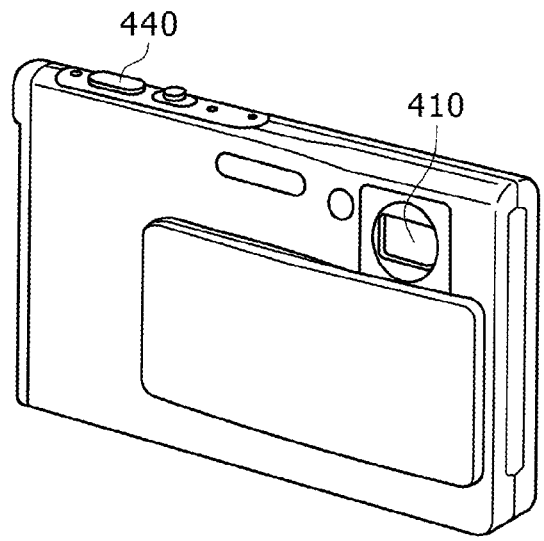
FIG. 14A is a perspective view showing the appearance of the front side of application example 2 and FIG. 14B is a perspective view showing the appearance of the back side.
Figure 14B:
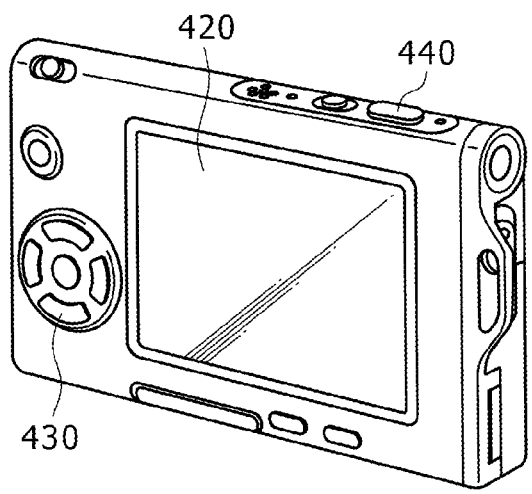

FIGS. 14A to 14B shows the appearance of a digital camera to which the display device of the above-described embodiments and so forth is applied. This digital camera has e.g. a light emitter 410 for flash, a display section 420, a menu switch 430, and a shutter button 440, and the display section 420 is configured by the display device according to the above-described embodiments and so forth.

Application Example 3

Figure 15:
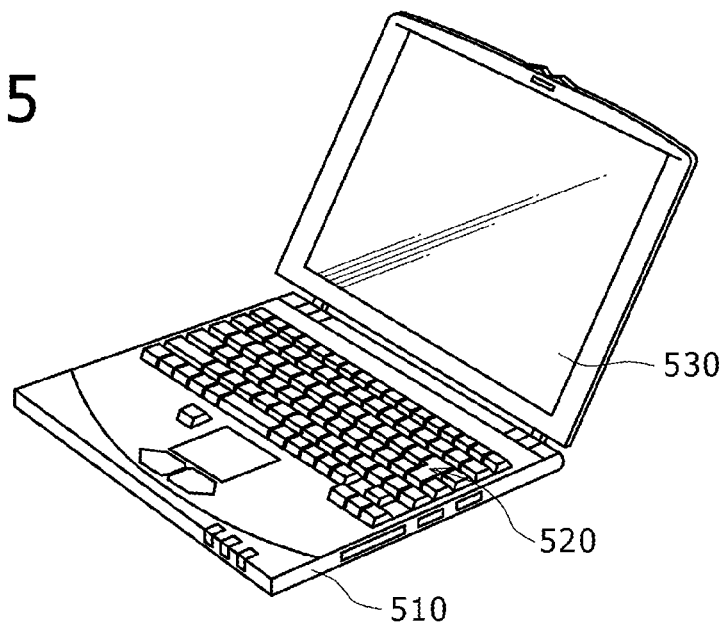
FIG. 15 is a perspective view showing the appearance of application example 3.

FIG. 15 shows the appearance of a notebook personal computer to which the display device of the above-described embodiments and so forth is applied. This notebook personal computer has e.g. a main body 510, a keyboard 520 for input operation of characters and so forth, and a display section 530 that displays images, and the display section 530 is configured by the display device according to the above-described embodiments and so forth.

Application Example 4

Figure 16:
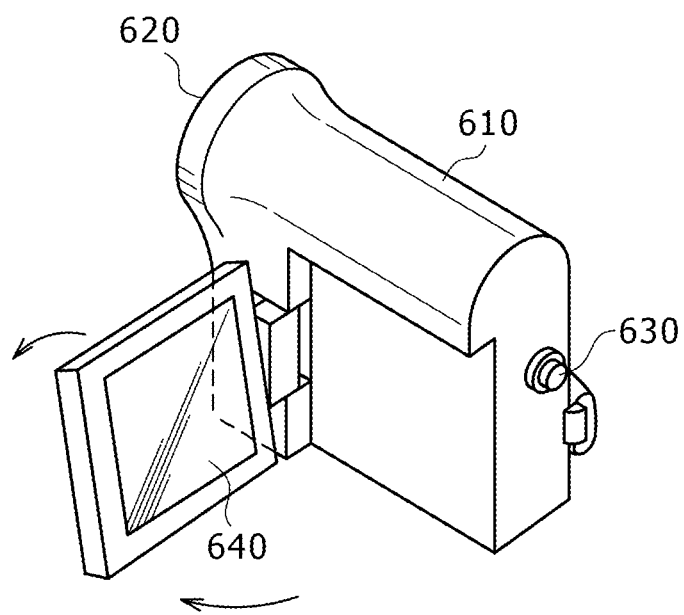
FIG. 16 is a perspective view showing the appearance of application example 4.

FIG. 16 shows the appearance of a video camcorder to which the display device of the above-described embodiments and so forth is applied. This video camcorder has e.g. a main body section 610, a lens 620 that is provided on the front side of this main body section 610 and is used for subject photographing, a start/stop switch 630 about photographing, and a display section 640, and the display section 640 is configured by the display device according to the above-described embodiments and so forth.

Application Example 5

FIGS. 17A to 17G shows the appearance of a cellular phone to which the display device of the above-described embodiments and so forth is applied. This cellular phone is made by coupling an upper chassis 710 with a lower chassis 720 by a coupling part (hinge part) 730 and has a display 740, a sub-display 750, a picture light 760, and a camera 770 for example. The display 740 or the sub-display 750 is configured by the display device according to the above-described embodiments and so forth.

The present disclosure is explained above by taking the embodiments and modification example. However, the present disclosure is not limited to the above-described embodiments and so forth and various modifications are possible. For example, in the above-described embodiments and so forth, the example in which the light emitting layer is printed by a reverse offset printing system is shown. However, the light emitting layer may be deposited by another printing method with use of a blanket, such as a gravure offset printing, or contact printing with use of an object other than the blanket, such as flexo printing. This is because, in the present embodiments and so forth, strong physical contact with the pixel forming area can be suppressed even when an object other than the blanket is used.

Furthermore, for example, the materials, thicknesses, film deposition methods, film deposition conditions, and so forth of the respective layers explained in the above-described embodiments are not limited. Other materials and thicknesses may be employed and other film deposition methods and film deposition conditions may be employed.

Moreover, the above-described embodiments are explained by specifically taking the configuration of the red pixel 10R, the green pixel 10G, and the blue pixel 10B. However, all layers do not need to be included and another layer may be further included.

In addition, in the above-described embodiments, a display device of three-primary-color displaying including red and green pixels as pixels other than the blue pixel (second pixel) is explained. However, the second pixel is at least one among red pixel, green pixel, yellow pixel, and white pixel, and preferably at least two among them. For example, embodiments of the present disclosure can be applied also to a display device of two-primary-color displaying composed of blue pixel and yellow pixel.

The present disclosure contains subject matter related to that disclosed in Japanese Priority Patent Application JP 2011-057573 filed in the Japan Patent Office on Mar. 16, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A display device comprising:
a plurality of pixels, each of the plurality of pixels comprising:
a first electrode, a light emitting layer, and a second electrode in that order over a substrate; and
an aperture insulator configured to allow only a portion of the light emitting layer to emit light;
wherein the plurality of pixels include:
a first pixel comprising a first light emitting layer common to the plurality of pixels;
a second pixel comprising:
the first light emitting layer; and
a second light emitting layer different from the first light emitting layer; and
a third pixel comprising:
the first light emitting layer; and
a third light emitting layer different from the first light emitting layer and the second light emitting layer;
wherein a first distance from a surface of the first electrode of the first pixel to a surface of the aperture insulator of the first pixel is greater than a second distance from a surface of the first electrode of the second pixel to a surface of the aperture insulator of the second pixel and a third distance from a surface of the first electrode of the third pixel to a surface of the aperture insulator of the third pixel is substantially the same as the second distance.

2. The display device according to claim 1, wherein:
the first electrode of the first pixel is thinner than the first electrode of the second pixel.

3. The display device according to claim 1, wherein:
the surface of the first electrode of the first pixel is divided into at least two regions by the aperture insulator.

4. The display device according to claim 1, wherein:
the first light emitting layer is a blue light emitting layer; and
the second light emitting layer is a red light emitting layer or a green light emitting layer.

5. An electronic apparatus including a display device, the display device comprising:
a plurality of pixels, each of the plurality of pixels comprising:
a first electrode, a light emitting layer, and a second electrode in that order over a substrate; and
an aperture insulator configured to allow only a portion of the light emitting layer to emit light;
wherein the plurality of pixels include:
a first pixel comprising a first light emitting layer common to the plurality of pixels;
a second pixel comprising:
the first light emitting layer; and
a second light emitting layer different from the first light emitting layer; and
a third pixel comprising:
the first light emitting layer; and
a third light emitting layer different from the first light emitting layer and the second light emitting layer;
wherein a first distance from a surface of the first electrode of the first pixel to a surface of the aperture insulator of the first pixel is greater than a second distance from a surface of the first electrode of the second pixel to a surface of the aperture insulator of the second pixel and a third distance from a surface of the first electrode of the third pixel to a surface of the aperture insulator of the third pixel is substantially the same as the second distance.

6. The display device according to claim 3, wherein:
the first electrode of the first pixel is thinner than the first electrode of the second pixel and the first electrode of the third pixel.

7. The display device according to claim 3, wherein:
the at least two regions of the first pixel are exactly two regions; and
a distance from a surface of an insulator separating the two regions of the first pixel to a first surface of the first electrode of the first pixel is at least 1.82 times a distance from the surface of the insulator separating the two regions of the first pixel to a first surface of the first electrode of the second pixel.

8. The display device according to claim 3, wherein:
the at least two regions of the first pixel are exactly three regions; and
a distance from a surface of an insulator separating the three regions of the first pixel to a first surface of the first electrode of the first pixel is at least 1.46 times a distance from the surface of the insulator separating the three regions of the first pixel to a first surface of the first electrode of the second pixel.

9. The display device according to claim 3, wherein:
the at least two regions of the first pixel are exactly four regions; and
a distance from a surface of an insulator separating the four regions of the first pixel to a first surface of the first electrode of the first pixel is at least 1.14 times a distance from the surface of the insulator separating the four regions of the first pixel to a first surface of the first electrode of the second pixel.

10. The electronic apparatus according to claim 5, wherein:
the first electrode of the first pixel is thinner than the first electrode of the second pixel.

11. The electronic apparatus according to claim 5, wherein:
the surface of the first electrode of the first pixel is divided into at least two regions by the aperture insulator.

12. The electronic apparatus according to claim 5, wherein:
the first light emitting layer is a blue light emitting layer; and
the second light emitting layer is a red light emitting layer or a green light emitting layer.

13. The electronic apparatus according to claim 11, wherein:
the first electrode of the first pixel is thinner than the first electrode of the second pixel and the first electrode of the third pixel.

14. The electronic apparatus according to claim 11, wherein:
the at least two regions of the first pixel are exactly two regions; and
a distance from a surface of an insulator separating the two regions of the first pixel to a first surface of the first electrode of the first pixel is at least 1.82 times a distance from the surface of the insulator separating the two regions of the first pixel to a first surface of the first electrode of the second pixel.

15. The electronic apparatus according to claim 11, wherein:
the at least two regions of the first pixel are exactly three regions; and
a distance from a surface of an insulator separating the three regions of the first pixel to a first surface of the first electrode of the first pixel is at least 1.46 times a distance from the surface of the insulator separating the three regions of the first pixel to a first surface of the first electrode of the second pixel.

16. The electronic apparatus according to claim 11, wherein:
the at least two regions of the first pixel are exactly four regions; and
a distance from a surface of an insulator separating the four regions of the first pixel to a first surface of the first electrode of the first pixel is at least 1.14 times a distance from the surface of the insulator separating the four regions of the first pixel to a first surface of the first electrode of the second pixel.

* * * * *